United States Patent [19]
Pietsch et al.

[11] Patent Number: 5,952,242
[45] Date of Patent: Sep. 14, 1999

[54] METHOD AND DEVICE FOR REMOVING A SEMICONDUCTOR WAFER FROM A FLAT SUBSTRATE

[75] Inventors: Georg Pietsch, Burghausen; Ernst Feuchtinger, Wittibreut, both of Germany

[73] Assignee: Wacker Siltronic Gesellschaft für Halbleitermaterialien AG, Burghausen, Germany

[21] Appl. No.: 08/954,785

[22] Filed: Oct. 21, 1997

[30] Foreign Application Priority Data

Nov. 18, 1996 [DE] Germany ............... 196 47 635

[51] Int. Cl.⁶ .................................................. H01L 21/00
[52] U.S. Cl. ........................ 438/692; 438/745; 156/345
[58] Field of Search ................................ 438/691, 692, 438/693, 747, 748, 753, 745; 156/345 LP; 216/88, 89, 90, 92, 99

[56] References Cited

U.S. PATENT DOCUMENTS 5,494,862  2/1996  Kato et al. ............... 438/753 X
5,527,209  6/1996  Volodarsqy et al. .

FOREIGN PATENT DOCUMENTS 8229807  9/1996  Japan .

OTHER PUBLICATIONS

Patent Abstracts of Japan, vol. 011, No. 344 (M–640) & JP 62 124844 A (Hitachi Ltd).

Patent Abstracts of Japan, vol. 097, No. 001 & JP08229807A (Fusiuoshi Mach Corp).

*Primary Examiner*—William Powell
*Attorney, Agent, or Firm*—Collard & Roe, P.C.

[57] ABSTRACT

A means for removing a semiconductor wafer from a flat substrate uses a device for removing a semiconductor wafer from a polishing cloth of a double side polishing machine. The method has a liquid being pressed through the substrate against the semiconductor wafer lying on the substrate, such that the semiconductor wafer is lifted up from the substrate by the action of the liquid. Then the wafer is picked up by a pick-up device.

9 Claims, 4 Drawing Sheets

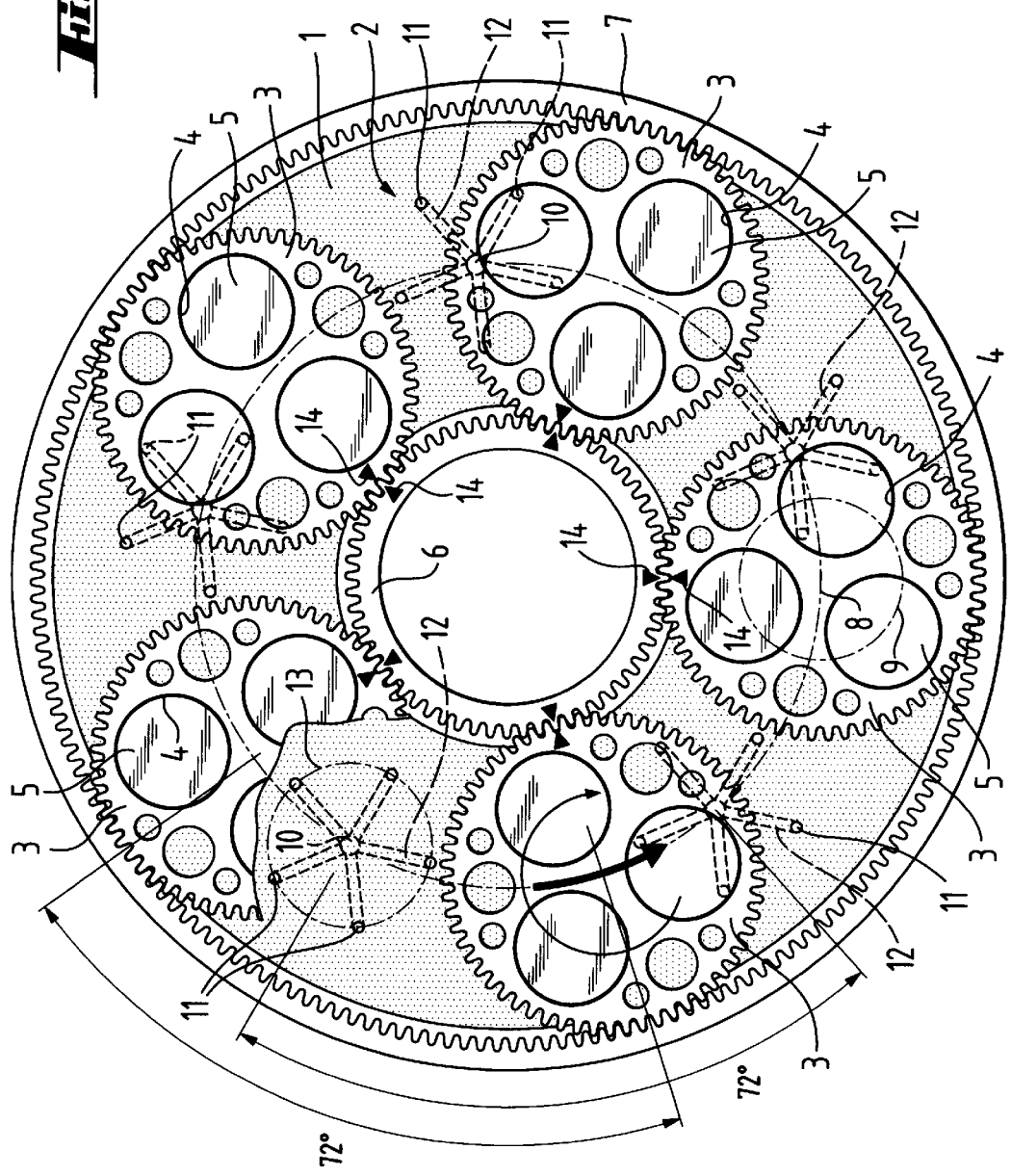

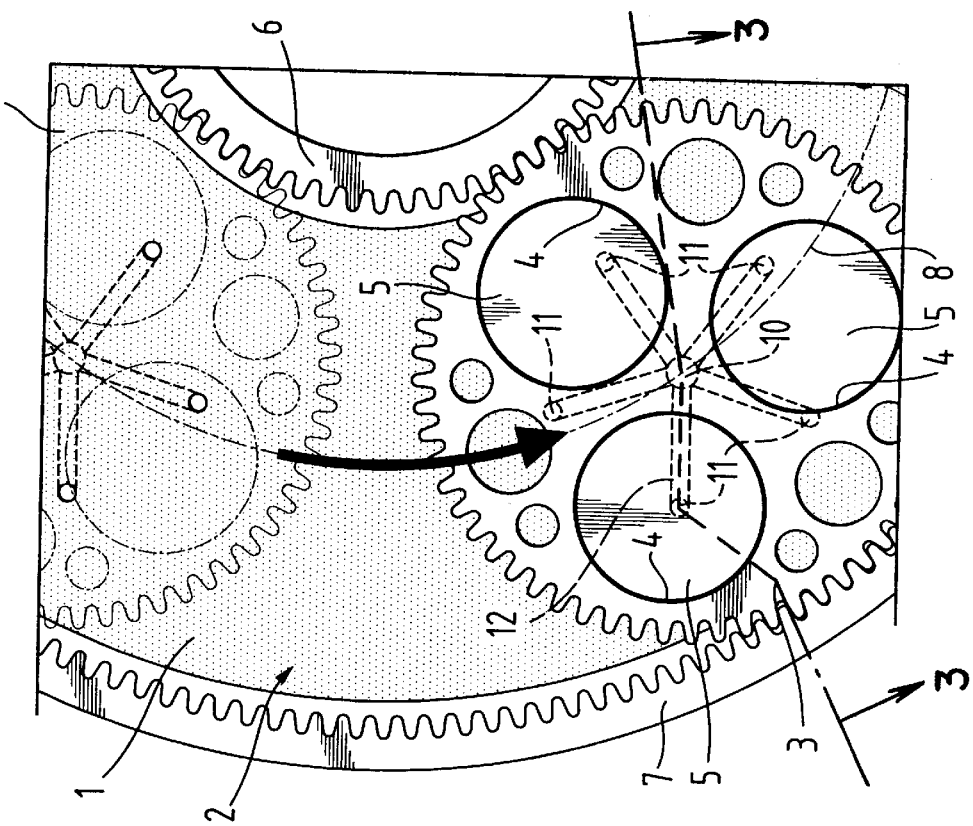
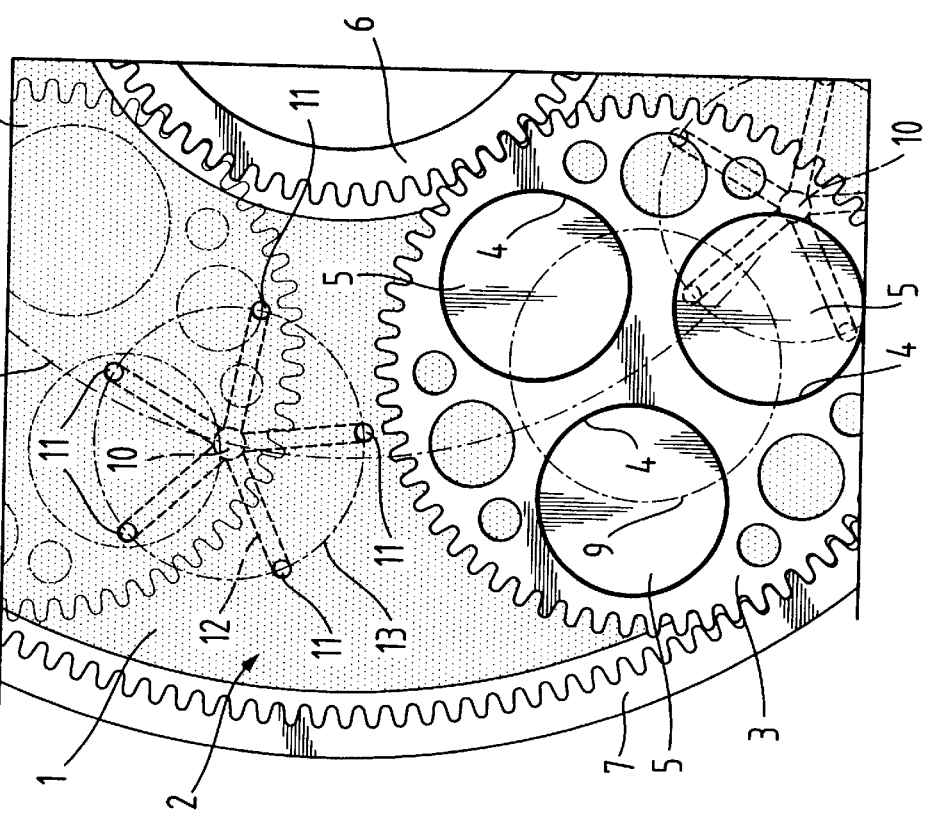

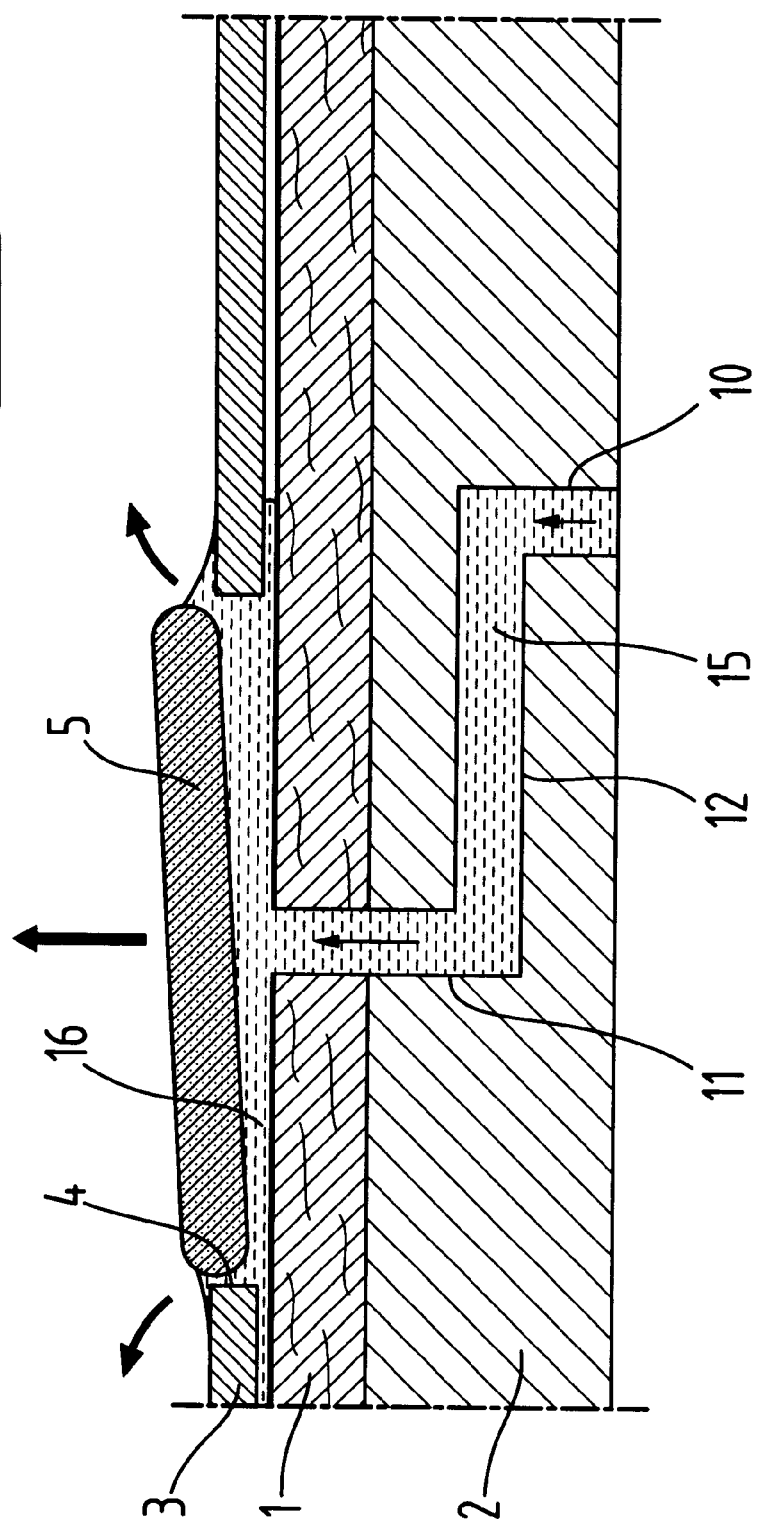

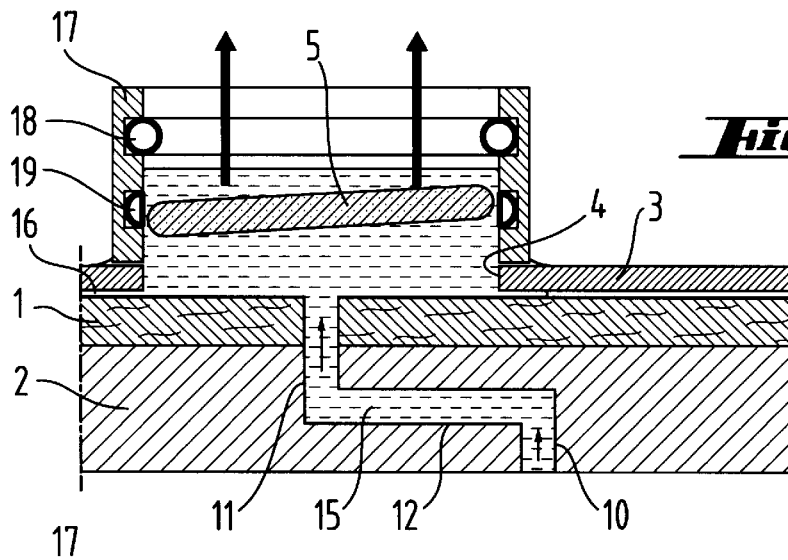
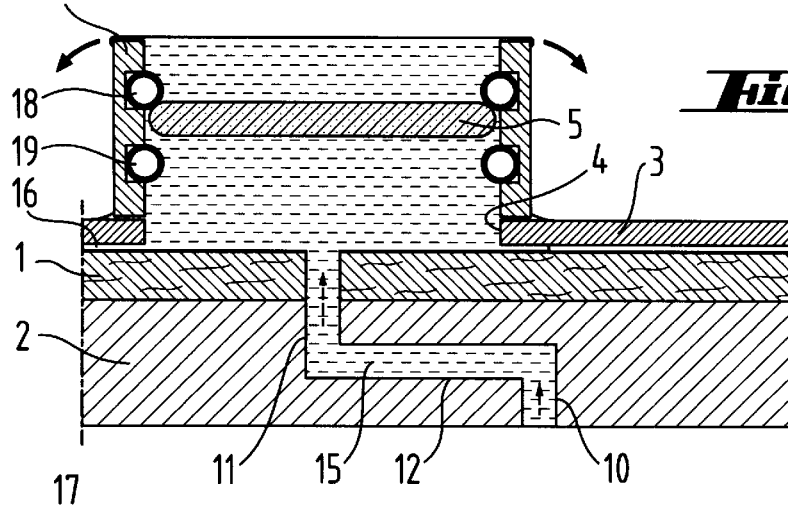
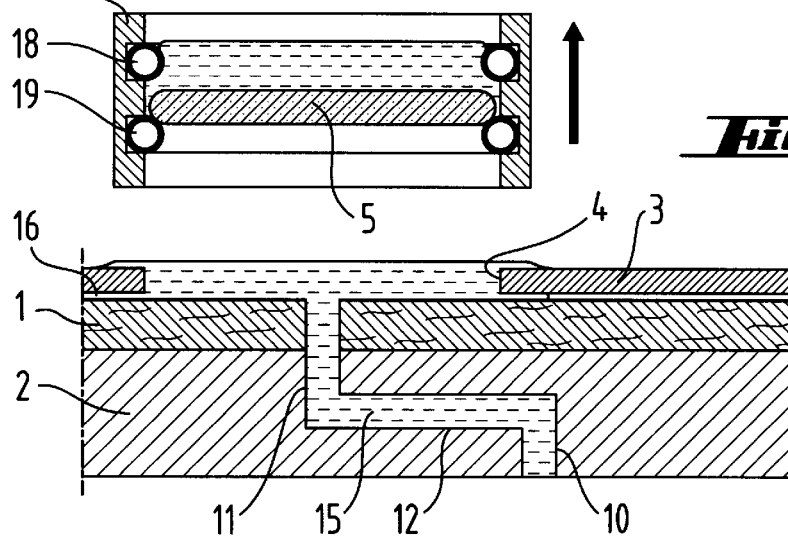

METHOD AND DEVICE FOR REMOVING A SEMICONDUCTOR WAFER FROM A FLAT SUBSTRATE

BACKGROUND OF THE INVENTION

1. Field of the Invention

The present invention relates to a method for removing a semiconductor wafer from a flat substrate, in particular from a polishing cloth of a double side polishing machine. The invention also relates to a device for removing a semiconductor wafer from a polishing cloth of a double side polishing machine.

2. The Prior Art

Making a semiconductor wafer planar by means of a chemical/mechanical polishing method forms an important processing step in the process sequence to produce a flat, defect-free and smooth semiconductor wafer. In many production sequences, this polishing step constitutes the last shaping step. Hence this polishing step decisively determines the surface properties, prior to the further use of the semiconductor wafer as starting material for the production of electrical, electronic and microelectronic components. One objective of the polishing method is, in particular, the achievement of a high evenness of the wafer sides (plane parallelity). Other objectives are the removal of surface layers which have been damaged by pretreatments ("damage removal") and the reduction of the microroughness of the semiconductor wafer. The two sides of a semiconductor wafer are distinguished as a rear side and a front side. As a rule, only the front side is used for the attachment of these component structures.

It is usual for single side and double side polishing methods to be used. In the case of single side polishing (SSP), following the mounting of the rear side onto a suitable carrier, only the front side is polished using a polishing cloth stretched onto a polishing plate. During the mounting, a positive and forcible connection is produced between the rear side and the carrier. This connection can be, for example by means of adhesion, bonding, cementing or the application of a vacuum. Single side polishing methods and devices are usual for treating single wafers ("single wafer polishing") or for the treatment of groups of wafers ("batch polishing"). In the case of double side polishing (DSP), the front side and rear side are polished simultaneously. During DSP, a plurality of semiconductor wafers are guided between upper and lower polishing plates covered by polishing cloths. In this case, the semiconductor wafers are located in thin guide cages, which are referred to as wafer carriers. These wafer carriers are also used in a similar form in the lapping of semiconductor wafers. Double side polishing methods and devices are always designed for the treatment of groups of semiconductor wafers ("batch polishing").

The successful production of microelectronic components having a high integration density places extreme requirements on the degree of flatness, freedom from defects and roughness of the semiconductor wafer produced by polishing. These requirements are satisfied in the best way if the semiconductor wafer is polished on both sides. There are advantages for having a polished wafer rear side in addition to having a polished wafer front side. These advantages flow inter alia, from the fact that a semiconductor wafer polished on both sides, by comparison with a semiconductor wafer polished only on one side, has significantly fewer disturbing particles. Other advantages include being simpler to clean, being less susceptible to contamination during its further processing and also being simpler in terms of being able to be measured, characterized and specified metrologically. Furthermore, as a result of the identical treatment of the sides, material stresses resulting from differently structured front and rear sides are avoided.

In principle, a semiconductor wafer that is polished on both sides can be produced by the front side and rear side being polished one after the other using a single side polishing method (sequential SSP). However, the method which is predominantly used in order to achieve polishing of both sides of a semiconductor wafer is double side polishing. The advantages of DSP over sequential SSP reside in the superior degree of achievable evenness of the side surfaces. This evenness is important in particular from the point of view of the plane-parallelity of the front side and the rear side of the wafer. This parallelity is decisive during further processing, and affects the ability to carry out the polishing in a more cost-effective manner. Further advantages of DSP include a higher throughput and the higher yield resulting from dispensing with the mounting, demounting and turning steps necessary in sequential SSP.

Each handling of a freshly polished semiconductor wafer using a mechanically acting handling tool, for example a gripper ("handler"), carries the risk of damaging a polished wafer surface. For example, this damage can result from the fact that impressions or scratches are produced. Such damage is particularly critical when it involves the front side of the semiconductor wafer. Freshly polished semiconductor wafers are also extremely sensitive to uncontrolled chemical attack, for example by an etching agent. The risk of such attack and hence impairment of the evenness of the polished surfaces exists in particular directly after chemical/mechanical polishing. At this point in time, a further chemical action of the polishing agent on the semiconductor wafer is damaging and must be stopped as rapidly as possible. This damage can be stopped, for example, by transferring the semiconductor wafer into a washing, neutralization or cleaning bath.

In the case of single side polishing or sequential SSP, the semiconductor wafer that is mounted on the carrier is removed as rapidly as possible from the polishing device without the mechanical action of a handling tool. The wafer is then immediately transported to a cleaning, washing or neutralization station. This method sequence may be carried out cost-effectively, fully automatically and with high protection of the semiconductor wafer against further chemical action by the polishing agent.

This removal method cannot be used for double side polishing, since the mounting necessary for this of the semiconductor wafer on a carrier does not exist. It is usual to use polishing cloths having different adhesion coefficients, for example polishing cloths made of various materials or having various texturings. This is done in order that all the semiconductor wafers are located on the lower polishing plate following the DSP and following the removal of the upper polishing plate, and are not distributed in a random fashion on the two polishing plates. Wafer removal with the aid of a mechanical handling tool, for example a robot arm that grips the semiconductor wafers one after the other is by vacuum holding of them. This lifts the wafers from the polishing cloth and transfers them into a washing or cleaning bath, but it runs the risk of scratching or breaking up the semiconductor wafer. The semiconductor wafer can only be lifted from the polishing cloth after strong adhesion forces (capillary forces) have been overcome. These forces can be traced back to a film of polishing agent residues, which is enclosed in a gap between the semiconductor wafer and the polishing cloth.

It is therefore usual for each semiconductor wafer to be removed manually from the polishing cloth, which requires special skill and care. The operator of the double side polishing machine has to lift the semiconductor wafer adhering to the polishing cloth carefully, using gloved fingers, by gripping underneath the rounded wafer edge. In the process, the semiconductor wafer must be deliberately subjected to bending, in order that the gap occupied by the polishing agent film is expanded slightly in a wedge shape. This will result in the polishing agent film in the gap shrinking back and slowly releasing the semiconductor wafer. If the design features of the polishing machine permit, it is instead also possible for the semiconductor wafer to be displaced laterally on the polishing cloth beyond the edge of the polishing plate, sliding on the adhesive (capillary) polishing agent film. One disadvantage of these methods of manual wafer removal is the continuing risk of mechanical and chemical damage to the semiconductor wafer. Other disadvantages are the lack of possible automation of the methods and the inability to track individual wafers. The last-mentioned term is understood to mean the increasingly requested requirement to be able at the same time to follow and record the actual manufacturing conditions for each individual semiconductor wafer in detail.

SUMMARY OF THE INVENTION

It is an object of the present invention to solve the problem of removing a semiconductor wafer from a flat substrate, in particular from a polishing cloth of a double side polishing machine, without mechanical damage to the front side or the rear side of the semiconductor wafer, in a short time and with the possibility of tracking individual wafers.

The present invention is directed to a method for removing a semiconductor wafer from a flat substrate comprising the steps of pressing a liquid through the flat substrate against the semiconductor wafer lying on the substrate; lifting the semiconductor wafer upwardly from the flat substrate by action of the liquid; and picking up the wafer by a pick-up device.

The liquid is selected from a group of liquids which includes water, aqueous washing and cleaning agents, non-aqueous liquid media, conditioning agents adapted to further treatment of the semiconductor wafer, for example hydrophilization agents, and arbitrary mixtures of the these liquids. Picking up the semiconductor wafer washed free by the liquid is preferably performed using a tool during whose use the risk of mechanical damage to the semiconductor wafer is low. Preference is given to a gripping tool which engages only at the edge of the semiconductor wafer and does not touch the front side or the rear side of the semiconductor wafer. It is also preferred to use a pick-up tool which vacuum holds one side of the semiconductor wafer. It is particularly preferred to provide a pick-up device with which it is possible to carry out the removal of the semiconductor wafer from the substrate automatically. Such a method and a pick-up device suitable for it are described in more detail below using a device for removing a semiconductor wafer from a polishing cloth of a double side polishing machine.

The present invention is also directed to a device for removing a semiconductor wafer from a polishing cloth of a double side polishing machine, comprising a polishing cloth having outlet bores, and said polishing cloth resting on a polishing plate; said polishing plate being provided with liquid leadthroughs which open into said outlet bores, said outlet bores pointing toward the semiconductor wafer, which is above the polishing cloth; and a pick-up device for the semiconductor wafer comprising a cylindrical guide and a blocking device which, in an activated state, prevents the semiconductor wafer from falling back onto the polishing cloth.

In a first step of the method, the device effects a non-contact washing free of the semiconductor wafer by expanding the capillary gap between the semiconductor wafer and the polishing cloth. This is achieved by pressing a suitable fluid through liquid leadthroughs in the lower polishing plate and exit bores in the polishing cloth. In a further step, the semiconductor wafer is lifted by the upward liquid pressure into a cylindrical pick-up container and, accordingly, is further washed all around its external surfaces by the liquid. The inner wall of the pick-up container functions as a cylindrical guide for the edge of the semiconductor wafer. The pick-up container has a blocking device which prevents the semiconductor wafer from falling back onto the polishing cloth after the liquid upward pressure has decreased.

The method of the invention and the device of the invention are distinguished in particular by the fact that the semiconductor wafer is washed free of contaminants without any mechanical handling. This is done preferably by using a liquid which does not attack the wafer chemically in an uncontrollable way. Furthermore, the picking up of the semiconductor wafer into the cylindrical pick-up container is performed only by guiding the edge of the semiconductor wafer. There is always a liquid film between the wafer edge and the inner wall of the pick-up container. This results in direct mechanical contact between the semiconductor wafer and the pick-up tool being avoided. Furthermore, the semiconductor wafer is able to sink slowly onto the blocking device, with continued washing all around the wafer by the liquid, and does not need to be "gripped" spontaneously by a tool. The entire procedure from washing free as far as the picking up of the semiconductor wafer in the pick-up container is thus carried out with constant washing of the semiconductor wafer ("wet-in-wet handling"). Moreover, the semiconductor wafer can be lifted from the polishing cloth immediately following the end of polishing. Also, the wafer can be freed from polishing agent residues, since the wafer carrier, in whose bore it is located, does not have to be removed beforehand. Finally, the method of the invention permits an unequivocal, comprehensible wafer/position assignment, so that tracking single wafers is possible in a simple way, even following the actual polishing.

BRIEF DESCRIPTION OF THE DRAWINGS

Other objects and features of the present invention will become apparent from the following detailed description considered in connection with the accompanying drawing which discloses embodiments of the present invention. It should be understood, however, that the drawing is designed for the purpose of illustration only and not as a definition of the limits of the invention.

In the drawing, wherein similar reference characters denote similar elements throughout the several views:

FIG. 1 shows a top view of the lower polishing plate of a double side polishing machine; and the upper polishing plate is not illustrated, for reasons of simplicity;

FIGS. 2A and 2B each show an enlarged top view of a portion of the lower polishing plate of FIG. 1;

FIG. 3 shows a partial section view through the lower polishing plate, along line 3—3 of FIG. 2B;

FIG. 4A shows the lower polishing plate of FIG. 3 in combination with the pick-up device of the invention;

FIG. 4B shows the combination of FIG. 4A plus having the lower blocking device being activated; and FIG. 4C shows the separation of the pick-up device holding a wafer from the lower polishing plate.

DETAILED DESCRIPTION OF PREFERRED EMBODIMENTS

Turning now in detail to the drawings, FIG. 1 shows toothed wafer carriers 3 having holes 4 into which semiconductor wafers 5 are inserted are located on a polishing plate 2 which is covered by a polishing cloth 1. The example illustrated is selected in such a way that there is space on the polishing plate for five wafer carriers. Each wafer carrier is able to accommodate three semiconductor wafers in its holes in a typically symmetrical arrangement. The teeth of the wafer carriers engage in an inner toothed ring 6 and in an outer toothed ring 7.

The kinematics of double side polishing are described by the interlinked movements of rotation of the wafer carriers (illustrated in FIG. 1 by a sharply curved thick arrow) and translation of the wafer carriers (illustrated in FIGS. 1 and 2B by a slightly curved thick arrow), as well as rotation(s) (not illustrated) of the plate carrying the polishing cloth. During polishing, the center points of the wafer carriers move uniformly on a large circular path 8 about the center point of the polishing plate. Also, the center points of the semiconductor wafers of one wafer carrier move on a small circular path 9 about the center point of the wafer carrier. This is shown on only one wafer carrier, and the contours of the wafer carriers are illustrated in an only indicative way for better understanding.

The essential features of the device are the liquid leadthroughs 10 through the polishing plate, which open into outlet bores 11 in the polishing cloth. A bundle 12 of outlet bores, which must lie on a circle 13 corresponding to the small circular path 9, belongs to each wafer carrier. The bundles of outlet bores must also correspond in number and angular distribution to the number and relative position of the wafer carriers. The five wafer carriers illustrated in the exemplary embodiment, are advantageously arranged in each case at an angle of 360°:5=72° with respect to one another. These five wafer carriers are therefore assigned five bundles of outlet bores, and the angles between the bundles likewise are 72°.

The wafer carriers are aligned in accordance with the distribution of the bundles of outlet bores only when they are first inserted onto the polishing plate, a procedure which is required only once. This is expediently carried out with the aid of corresponding marking marks 14 on the inner toothed ring 6 or the polishing plate and the respective wafer carrier. In the case of the exemplary embodiment illustrated, having three semiconductor wafers per wafer carrier, a number of at least five outlet bores per bundle should be provided. This is in order to ensure that in each case at least one outlet bore can be brought to lie underneath a semiconductor wafer of the wafer carrier.

In order to be able to remove all the semiconductor wafers from the polishing plate in a manner according to the invention, the circles 13, on which in each case one bundle of outlet bores is located, and the small circular paths 9, which correspond to the movement of the center points of the semiconductor wafers of a wafer carrier, are brought into coincidence in pairs. This may be carried out either by following up the angular position of the polishing plate 2 or by means of further translation of the wafer carriers. For example, it can be performed automatically with the aid of known vector-controlled servomotors at the end of the polishing travel. Such a movement is illustrated in schematic form in FIGS. 2A and 2B. FIG. 2A shows a situation in which the outlet bores 11 are not yet located in the envisaged position. In the illustration according to FIG. 2B, this is the case and the semiconductor wafers can be removed according to the invention from the polishing cloth. This is because there is at least one outlet bore beneath each semiconductor wafer, irrespective of the intrinsic angle of rotation of the wafer carrier.

FIG. 3 shows the principle of washing free a semiconductor wafer 5 inserted into the bore 4 of a wafer carrier 3. This is by means of pressing a suitable liquid 15 into the gap 16 between polishing cloth 1 and semiconductor wafer 5. By pressing liquid through the liquid leadthrough 10 and the outlet bores 11 in the polishing cloth, the gap 16 is widened. At the same time, the semiconductor wafer 5 is lifted (illustrated in FIG. 3 by a thick arrow) and washed around its edges by liquid 15. Excess liquid escapes through the opening between the edge of the semiconductor wafer and the bore in the wafer carrier (illustrated in FIG. 3 by curved arrows).

In principle, it is possible to guide the liquid through or along the axis of the lower polishing plate 2 to the liquid leadthroughs 10. However, because of the necessity for contact between the liquid and the moving parts, there is a risk of contamination of the liquid. This contamination could be transferred to the semiconductor wafer. It is therefore preferred to lead the liquid at zero pressure to the lower polishing plate and to conduct it via a drain into an annular catching trough that is connected to the polishing plate. The catching trough may be arranged, for example, inside the inner toothed ring or outside the outer circumference of the polishing plate. From the catching trough, the liquid is pressurized with the aid of pumps, preferably diaphragm metering pumps that co-rotate with the polishing plate, and led to the respective liquid leadthroughs.

As soon as a semiconductor wafer has been washed free, as illustrated in FIG. 3, it can be picked up using a pick-up tool. An example of this tool is a gripping tool which engages at the edge of the semiconductor wafer, or a vacuum forceps which vacuum holds the free side of the semiconductor wafer. In the case of this manner of picking up the wafer, it is advantageous to provide biased non-return valves in the outlet openings. These valves automatically close when the pressure drops. These valves also prevent a semiconductor wafer that has been washed free from being thrown out of the bore of the wafer carrier.

In a particularly preferred embodiment of the invention, the semiconductor wafer is washed free automatically and is picked up with the aid of a pick-up device that likewise operates automatically. The pick-up device and its functional principle are shown in FIGS. 4A–4C.

Even before the semiconductor wafer 5 is washed free, a cylindrical removal head 17, whose diameter corresponds to the internal diameter of the bore 4 in the wafer carrier 3 is placed into position. Removal head diameter is slightly larger than the external diameter of the semiconductor wafer, and head 17 is placed centrally down over the semiconductor wafer 5 on the wafer carrier 3 (FIG. 4A). In the process, a positive and force-transmitting connection is produced between the removal head and the wafer carrier. This has the result that the liquid is conducted into the removal head when the semiconductor wafer is being washed free. The centering of the removal head can be facilitated, for example, by guide bores in the wafer carrier and associated fitting centering pins on the removal head. The removal head which has been put down fixes the wafer carrier on the polishing plate. Thus, the wafer carrier cannot float upwardly, even if an outlet opening has also accidentally come to lie under this wafer carrier.

After the picking up of the semiconductor wafer has occurred in this manner, the semiconductor wafer is pressed into the gap 16 between the semiconductor wafer 5 and the polishing cloth 1. This is done by feeding liquid through the liquid leadthrough 10 and the outlet bore 11, as already described. The semiconductor wafer is then lifted off from the polishing cloth by the liquid pressure and the wafer begins to migrate upwardly into the removal head (FIG. 4A). Liquid flowing behind presses the semiconductor wafer further upwardly into the removal head as far as an activated, upper blocking device 18. By means of device 18, the inner diameter of the removal head is narrowed to such an extent that the semiconductor wafer is prevented at its edge from continuing the upwardly directed movement. Liquid flowing further behind emerges at the open upper end of the removal head (illustrated in FIG. 4B by curved arrows). As soon as the semiconductor wafer has reached the upper blocking device 18, provision is made to reduce the liquid supply (illustrated in FIG. 4B by dashed arrows). At the same time, a lower blocking device 19 is activated, and the semiconductor wafer had passed device 19 during its upward movement (FIG. 4B). After this, the semiconductor wafer is caught and held in the removal head 17 and can no longer fall back onto the polishing cloth 1.

Particularly suitable as a blocking device are hoses or bellows (retaining beads), which in a non-activated, zero-pressure state run annularly around the inner wall of the removal head and terminate flush with the inner wall. Their activation is performed pneumatically, for example by filling with very clean air, or hydraulically, for example by filling with water. When this is done they expand into the removal head and narrow it, so that its internal diameter becomes smaller at the relevant point than the diameter of the semiconductor wafer. Alternatively, any type of blocking latches which can be activated magnetically, by an electric motor, pneumatically or hydraulically, may be used instead of retaining beads. However, a blocking device should have at least three such blocking latches which are spaced apart uniformly from one another, so that the edge of the semiconductor wafer is supported at three supporting points provided by the blocking latches.

With the advantage of particular operational security, it is also possible to use a divided ring of expansible material which runs around in a groove in the removal head and projects out of the groove into the removal head when it is in the zero-pressure, shortened state. In this state, the ring acts as an activated blocking device. Only after the application of, for example, hydraulic or pneumatic pressure is the ring stretched to such an extent that it disappears completely into the groove. Since the ring is in the zero-pressure state holding back the semiconductor wafer when energy is not being supplied, it is not possible for the semiconductor wafer to fall out of the removal head, for example following a sudden failure of the power or liquid. A similar security concept can be achieved even in the case of using retaining beads or blocking latches, for example by these blocking devices being retained in the non-blocking state by the application of a vacuum.

FIG. 4C shows that removal head 17 is finally lifted upwardly together with the semiconductor wafer 5, which is prevented from dropping or falling back toward the polishing cloth. At the same time, the supply of further liquid is discontinued, in order to avoid floating up of the wafer carrier, which is now no longer being held down. Because of the discontinuation of the supply of liquid, the hydraulic lifting of the semiconductor wafer in the removal head ceases. The semiconductor wafer is now no longer pressed against the upper blocking device 18, but sinks slowly downward, until it is supported by the lower blocking device 19.

The semiconductor wafer is removed from the removal head by the lower blocking device being deactivated. The semiconductor wafer then falls out of the removal head and is available for the further treatment intended in each case. In this way, it is possible for the semiconductor wafer, for example, to be fed to a commercial wet tray filler having wafer feed by water chute and a tray indexer.

The washing free of polished semiconductor wafers from the polishing cloth and their picking up in a pick-up device are preferably carried out fully automatically. The semiconductor wafers located in the wafer carriers are washed free and picked up in accordance with a predetermined plan. It is preferable if a sequential removal sequence is maintained in relation to the wafer carriers present. In this case, one wafer carrier after the next is moved into a fixed removal position by means of synchronous further cycling of the polishing table. In order to increase the removal speed, it is proposed to wash free and pick up the semiconductor wafers from one wafer carrier at the same time. For this purpose, the same number of removal heads are combined into one unit and operated at the same time as the number of wafers that are inserted into the wafer carrier.

While several embodiments of the present invention have been shown and described, it is to be understood that many changes and modifications may be made thereunto without departing from the spirit and scope of the invention as defined in the appended claims.

What is claimed is:

1. Method for removing a semiconductor wafer from a flat substrate, comprising the steps of
    pressing a liquid through the flat substrate against the semiconductor wafer lying on the substrate;
    lifting the semiconductor wafer upwardly from the flat substrate by action of the liquid; and
    picking up the wafer by a pick-up device.
2. Method according to claim 1,
    wherein said pick-up device is a pick-up container;
    washing the semiconductor wafer by the liquid into said pick-up container; and
    preventing the semiconductor wafer from falling back onto the substrate.
3. Method according to claim 2,
    wherein the lifting of the semiconductor wafer and the washing of the semiconductor wafer into the pick-up container are performed in an automated method step.
4. Method according to claim 1,
    wherein the semiconductor wafer is picked up by said pick-up device, by touching the semiconductor wafer only at an edge region of the wafer.
5. Method according to claim 1, comprising
    picking up the semiconductor wafer by one side of the semiconductor wafer being vacuum held by a pick-up tool.
6. Method according to claim 1,
    wherein said substrate comprises a polishing cloth of a double side polishing machine.
7. Device for removing a semiconductor wafer from a polishing cloth of a double side polishing machine, comprising a polishing cloth having outlet bores, and said polishing cloth resting on a polishing plate;

said polishing plate being provided with liquid leadthroughs which open into said outlet bores, said outlet bores pointing toward the semiconductor wafer, which is above the polishing cloth; and a pick-up device for the semiconductor wafer comprising a cylindrical guide and a blocking device which, in an activated state, prevents the semiconductor wafer from falling back onto the polishing cloth.

8. Device according to claim 7, wherein the blocking device is activated by a means selected from the group consisting of a pneumatic means, a hydraulic means, an electric motor, a magnetic means, and a vacuum means.

9. Device according to claim 7, wherein the blocking device is deactivated by a means selected from the group consisting of a pneumatic means, a hydraulic means, an electric motor, a magnetic means, and a vacuum means.

* * * * *